(12) United States Patent
Naniwa

(10) Patent No.: US 11,296,660 B2
(45) Date of Patent: Apr. 5, 2022

(54) RADIO-FREQUENCY MODULE AND COMMUNICATION APPARATUS

(71) Applicant: Murata Manufacturing Co., Ltd., Kyoto (JP)

(72) Inventor: Yusuke Naniwa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 94 days.

(21) Appl. No.: 16/829,477

(22) Filed: Mar. 25, 2020

(65) Prior Publication Data
US 2020/0228073 A1    Jul. 16, 2020

Related U.S. Application Data

(63) Continuation of application No. PCT/JP2018/034664, filed on Sep. 19, 2018.

(30) Foreign Application Priority Data

Sep. 29, 2017 (JP) .............................. JP2017-192157

(51) Int. Cl.
*H03F 3/19* (2006.01)
*H03F 1/56* (2006.01)
*H04B 1/40* (2015.01)

(52) U.S. Cl.
CPC .............. *H03F 3/19* (2013.01); *H03F 1/565* (2013.01); *H04B 1/40* (2013.01); *H03F 2200/171* (2013.01); *H03F 2200/222* (2013.01)

(58) Field of Classification Search
CPC ...... H03F 3/19; H03F 1/565; H03F 2200/171; H03F 2200/222; H04B 1/40
(Continued)

(56) References Cited

U.S. PATENT DOCUMENTS

2010/0157860 A1    6/2010   Hagiwara et al.
2010/0273535 A1   10/2010   Inamori et al.
2011/0136462 A1    6/2011   Dimpflmaier et al.

FOREIGN PATENT DOCUMENTS

JP    2002057597 A    2/2002
JP    2009290897 A   12/2009
(Continued)

OTHER PUBLICATIONS

International Search Report for International Application No. PCT/JP2018/034664, dated Oct. 16, 2018.
(Continued)

*Primary Examiner* — Hafizur Rahman
(74) *Attorney, Agent, or Firm* — Pearne & Gordon LLP

(57) ABSTRACT

A radio-frequency module includes a substrate, a first circuit arranged on the substrate and includes a first amplifier for amplifying a diversity signal, and a second circuit arranged on the substrate and includes a second amplifier for amplifying a MIMO signal. The first amplifier and the second amplifier are formed on a single component and are arranged in a central portion in a plan view of the substrate. The first circuit and the second circuit may include a first matching element connected to the first amplifier and a second matching element connected to the second amplifier, respectively. The first amplifier and the second amplifier may be arranged in the central portion on a first main surface of the substrate. The first matching element and the second matching element may be arranged in the central portion on a second main surface of the substrate.

9 Claims, 4 Drawing Sheets

(58) Field of Classification Search
USPC .......................................................... 330/302
See application file for complete search history.

(56) References Cited

FOREIGN PATENT DOCUMENTS

JP   2010273321 A   12/2010
JP   2016127487 A   7/2016

OTHER PUBLICATIONS

Written Opinion for International Application No. PCT/JP2018/034664, dated Oct. 16, 2018.

FIG. 1
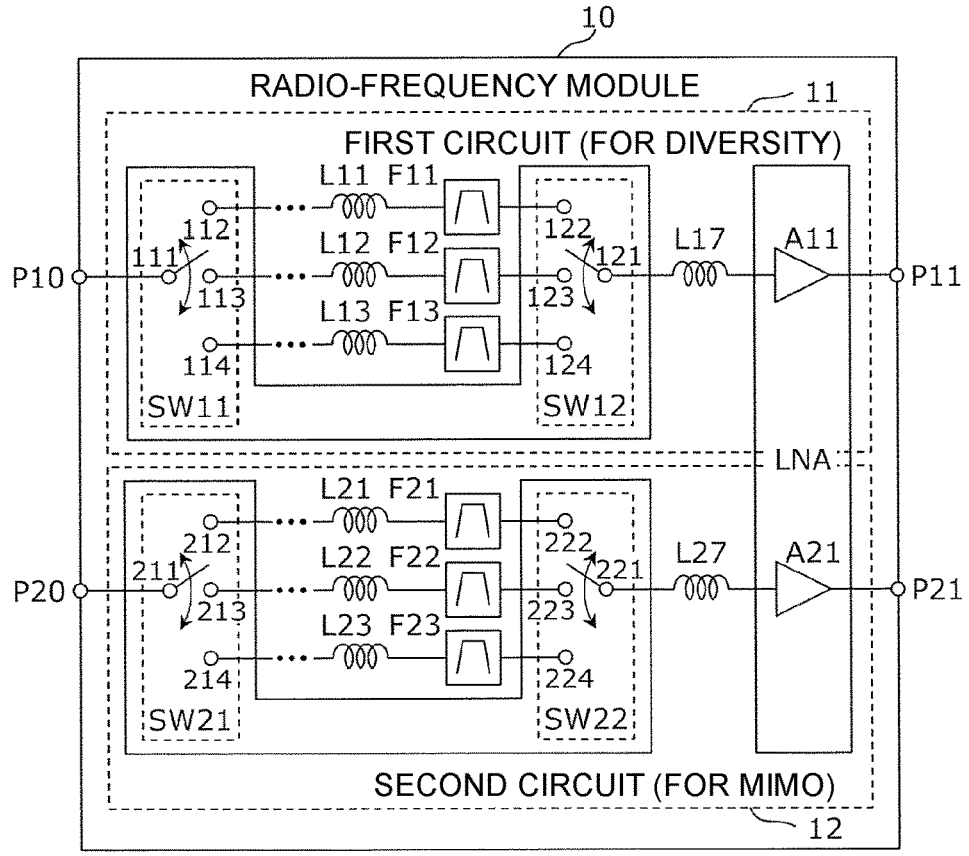
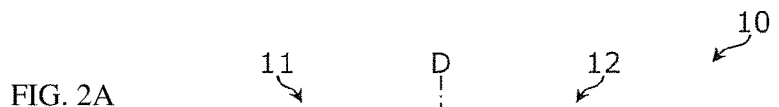
FIG. 2A
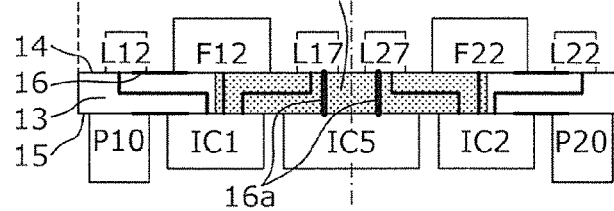
FIG. 2B

RADIO-FREQUENCY MODULE AND COMMUNICATION APPARATUS

This is a continuation of International Application No. PCT/JP2018/034664 filed on Sep. 19, 2018 which claims priority from Japanese Patent Application No. 2017-192157 filed on Sep. 29, 2017. The contents of these applications are incorporated herein by reference in their entireties.

BACKGROUND

The present disclosure relates to radio-frequency modules and communication apparatuses. In particular, the present disclosure relates to a radio-frequency module and a communication apparatus adaptable to communication using a diversity antenna and MIMO communication.

Technologies to improve communication performance using multiple antennas are adopted in communication apparatuses, such as mobile phones, in recent years. Use of a diversity antenna in addition to a main antenna and a communication system using a multiple input multiple output (MIMO) method are examples of such technologies. The MIMO is a technology to perform spatial multiplexing of multiple signals using multiple antennas for transmission and reception to improve the communication speed, such as throughput.

It is necessary to provide a front-end circuit capable of individually processing signals of the respective antennas in the communication using the diversity antenna and the MIMO communication.

For example, Japanese Unexamined Patent Application Publication No. 2009-290897 discloses a radio-frequency circuit component having a configuration in which circuit elements including at least two antenna terminals and at least two filter circuits are arranged on an integrated laminated substrate. Shield electrodes are arranged between the filter circuits. In the shield electrode, through-hole electrodes are arranged in a line at predetermined intervals. The radio-frequency circuit component is capable of individually processing signals transmitted via the two antenna terminals while keeping excellent isolation between the filter circuits. Japanese Unexamined Patent Application Publication No. 2009-290897 indicates an example of the arrangement of the circuit elements in the radio-frequency circuit component on the laminated substrate in FIG. 22.

In communication systems using the main antennas, communication systems using the diversity antennas, and highly-functional communication apparatuses adopting various communication technologies including the MIMO, it is constantly required to mount the circuits that are likely to be increased in size in more compact sizes.

BRIEF SUMMARY

Accordingly, the present disclosure provides a radio-frequency module that is capable of individually processing multiple radio-frequency signals corresponding to different antennas and that is appropriate for the reduction in size.

A radio-frequency module according to an embodiment of the present disclosure includes a substrate, a first circuit that is arranged on the substrate and that includes a first amplifier for amplifying a diversity signal, and a second circuit that is arranged on the substrate and that includes a second amplifier for amplifying a MIMO signal. The first amplifier and the second amplifier are formed on a single component and are arranged in a central portion in a plan view (viewed in a direction perpendicular to the main surface of the substrate) of the substrate.

According to the present disclosure, the radio-frequency module is realized, which is capable of individually processing the diversity signal and the MIMO signal and which is appropriate for reduction of the size.

Other features, elements, characteristics and advantages of the present disclosure will become more apparent from the following detailed description of embodiments of the present disclosure with reference to the attached drawings.

BRIEF DESCRIPTION OF SEVERAL VIEWS OF THE DRAWINGS

FIG. 1 is a circuit diagram illustrating an example of the functional circuit configuration of a radio-frequency module according to a first embodiment;

FIG. 2A and FIG. 2B are a plan view and a side view schematically illustrating an example of the arrangement of components in the radio-frequency module according to the first embodiment;

DETAILED DESCRIPTION

Figure 3:
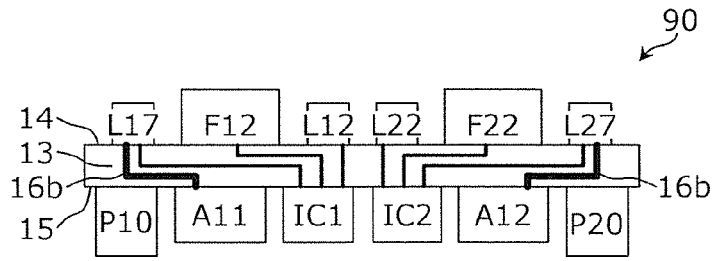
FIG. 3 is a side view schematically illustrating an example of the arrangement of components in a radio-frequency module according to a comparative example.

Embodiments of the present disclosure will herein be described in detail with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure.

First Embodiment

A radio-frequency module according to a first embodiment will now be described, giving as an example a module that processes reception signals through a first antenna and a second antenna in a communication apparatus including the first antenna, the second antenna, and a third antenna. The first antenna and the second antenna may be a diversity antenna and an antenna used in the MIMO communication, respectively, as examples and the third antenna may be a main antenna as an example. The radio-frequency module exemplified here supports multiband communication in which communication is performed by selectively using multiple frequency bands. The entire configuration of the communication apparatus will be described in detail below.

FIG. 1 is a circuit diagram illustrating an example of the functional circuit configuration of a radio-frequency module 10 according to the first embodiment. Referring to FIG. 1, the radio-frequency module 10 includes a first circuit 11 and a second circuit 12.

The first circuit 11 includes an input terminal P10, a switch SW11, matching elements (for example, inductors L11, L12, and L13 illustrated in FIG. 1), filters F11, F12, and F13, a switch SW12, an inductor L17, an amplifier A11, and an output terminal P11. Here, the inductor L17 is an example of a first matching element, the amplifier A11 is an example of a first amplifier, and the filters F11, F12, and F13 are an example of multiple first filters.

The second circuit 12 includes an input terminal P20, a switch SW21, matching elements (for example, inductors L21, L22, and L23 illustrated in FIG. 1), filters F21, F22, and F23, a switch SW22, an inductor L27, an amplifier A21, and an output terminal P21. The inductor L27 is an example of a second matching element, the amplifier A21 is an example of a second amplifier, and the filters F21, F22, and F23 are an example of multiple second filters.

It is assumed for convenience of description that the first circuit 11 and the second circuit 12 have the same circuit configuration, and the circuit configuration of the first circuit 11 will be representatively described here.

The input terminal P10 acquires reception signals received with the diversity antenna.

The switch SW11 has a common terminal 111 and selection terminals 112, 113, and 114. The switch SW11 connects the common terminal 111 to one selection terminal of the selection terminals 112, 113, and 114 in accordance with a control signal (not illustrated). The common terminal 111 is connected to the input terminal P10.

The switch SW12 has a common terminal 121 and selection terminals 122, 123, and 124. The switch SW12 connects one selection terminal of the selection terminals 122, 123, and 124 to the common terminal 121 in accordance with a control signal (not illustrated).

The inductors L11, L12, and L13 and the filters F11, F12, and F13 are provided for a first frequency band, a second frequency band, and a third frequency band, respectively, used in the multiband communication.

The inductors L11, L12, and L13 are matching elements for achieving impedance matching at input ends of the filters F11, F12, and F13, respectively. The inductors L11, L12, and L13 are connected on signal paths connecting the selection terminals 112, 113, and 114 of the switch SW11 to the input ends of the filters F11, F12, and F13, respectively.

The filters F11, F12, and F13 are band pass filters that selectively transmit signals of the corresponding frequency bands. One end of the filter F11 is connected to the selection terminal 112 of the switch SW11, one end of the filter F12 is connected to the selection terminal 113 of the switch SW11, and one end of the filter F13 is connected to the selection terminal 114 of the switch SW11. The other end of the filter F11 is connected to the selection terminal 122 of the switch SW12, the other end of the filter F12 is connected to the selection terminal 123 of the switch SW12, and the other end of the filter F13 is connected to the selection terminal 124 of the switch SW12.

The inductor L17 is a matching element for achieving impedance matching at an input end of the amplifier A11. The inductor L17 is connected on a signal path connecting the common terminal 121 of the switch SW12 to the input end of the amplifier A11.

The amplifier A11 is a low noise amplifier. The input end of the amplifier A11 is connected to the common terminal 121 of the switch SW12 and an output end of the amplifier A11 is connected to the output terminal P11. The amplifier A11 may include an additional circuit, such as a digital control circuit, in addition to a main semiconductor element that amplifies a signal.

With the above configuration, the first circuit 11 selectively amplifies a signal of a desired frequency band, which is included in the reception signals through the diversity antenna.

The second circuit 12 has the same circuit configuration as that of the first circuit 11 and selectively amplifies a signal of a desired frequency band, which is included in the reception signals through the MIMO antenna. Reference letters and numerals resulting from replacement of the first figures of the reference letters and numerals of the corresponding circuit elements in the first circuit 11 with two are add to the respective circuit elements in the second circuit 12 and a description of the circuit elements in the second circuit 12 is omitted herein.

The circuit configuration of the radio-frequency module 10 in FIG. 1 is only an example for description and is not intended to limit the circuit configuration of the radio-frequency module. For example, although the inductors L11 to L13, L17, L21 to L23, and L27 are indicated as series Ls inserted into the signal paths in FIG. 1, the inductors L11 to L13, L17, L21 to L23, and L27 may be parallel Ls the one ends of which are connected to the signal paths and the other ends of which are grounded. In addition, matching inductors, which are not illustrated in FIG. 1, may be additionally provided.

The radio-frequency module 10 is practically configured by arranging the specific components functioning as the circuit elements described with reference to FIG. 1 on a substrate. How the components in the radio-frequency module 10 are arranged will now be described.

FIG. 2A and FIG. 2B are a plan view and a side view schematically illustrating an example of the arrangement of the components in the radio-frequency module 10. FIG. 2A is a plan view when a substrate 13 is viewed from a main surface 14 side. The components arranged on the main surface 14 are indicated with solid lines and the components arranged on a main surface 15 are indicated with broken lines. FIG. 2B is a side view when the circuit components appearing on the cross-section taken along the II-II line in FIG. 2A are viewed from the direction of arrows.

As illustrated in FIG. 2A and FIG. 2B, the radio-frequency module 10 is configured by arranging the multiple components on the main surfaces 14 and 15 of the substrate 13 and connecting the components with lines 16.

Chip inductors L11 to L13, L17, L21 to L23, and L27 and filter components F11 to F13 and F21 to F23 are mounted on the main surface 14 of the substrate 13.

The chip inductors L11 to L13, L17, L21 to L23, and L27 function as the inductors L11 to L13, L17, L21 to L23, and L27 to which the same reference letters and numerals are added in FIG. 1. The chip inductors L11 to L13, L17, L21 to L23, and L27 may be of a winding type composed of a conducting line that is wound around a core or may be of a laminated type composed of a conductor pattern that is formed around a laminated substrate in a substantially coiled shape, as a non-limited example.

The filter components F11 to F13 and F21 to F23 function as the filters F11 to F13 and F21 to F23 to which the same reference letters and numerals are added in FIG. 1. Each of the filter components F11 to F13 and F21 to F23 may be an LC filter composed of an inductor and a capacitor or may be an acoustic wave filter using an acoustic wave device, as a non-limited example.

The acoustic wave filter may be a surface acoustic wave (SAW) filter or a bulk acoustic wave (BAW) filter.

The SAW filter includes a substrate and an interdigital transducer (IDT) electrode. The substrate has piezoelectricity at least on the surface. For example, the SAW filter may be composed of a multilayer body including a piezoelectric thin film on its surface, a film having an acoustic velocity different from that of the piezoelectric thin film, a supporting substrate, and so on. The substrate may entirely have the piezoelectricity. In this case, the substrate is a piezoelectric substrate composed of one piezoelectric layer.

Integrated devices IC1, IC2, and IC5 are mounted on the main surface 15 of the substrate 13, and the input terminals P10 and P20 and the output terminals P11 and P21 are provided on the main surface 15 of the substrate 13. Broken-line circles with no reference letter and numeral illustrated in FIG. 2A may be a power supply, ground, and various control-signal terminals, other than the input terminals P10 and P20 and the output terminals P11 and P21.

The integrated device IC1 is an IC in which the switches SW11 and SW12 illustrated in FIG. 1 are integrated in a single package. The integrated device IC2 is an IC in which the switches SW21 and SW22 illustrated in FIG. 1 are integrated in a single package.

The integrated device IC5 is an IC in which the amplifiers A11 and A21 illustrated in FIG. 1 are integrated in a single package with an additional circuit, such as a digital control circuit.

Each of the terminals including the input terminals P10 and P20 and the output terminals P11 and P21 is an electrode pin having a profile higher than those of the integrated devices IC1, IC2, and IC5 and functions as a connection terminal in mounting of the radio-frequency module 10 on a mother board.

The components arranged on the main surface 14 are connected to the components arranged on the main surface 15 with the lines 16 provided in the thickness direction and the in-plane direction of the substrate 13 to from the first circuit 11 and the second circuit 12.

As illustrated in FIG. 2A and FIG. 2B, the first circuit 11 is formed in a first portion A (the left half in the example in FIG. 2A and FIG. 2B) in a plan view of the substrate 13 and the second circuit 12 is formed in a second portion B (the right half in the example in FIG. 2A and FIG. 2B) being in contact with the first portion A in a plan view of the substrate 13.

The amplifier A11 and the amplifier A21 are arranged in a central portion C (a shaded area in the example in FIG. 2A and FIG. 2B) of the substrate 13 as the integrated device IC5, which is a single component. Here, the central portion C may be a portion that includes a boundary line D between the first portion A and the second portion B and that occupies a half of the distance to the opposite sides of the boundary line D toward both sides of the boundary line D.

Arranging the amplifiers A11 and A21 in the central portion C enables not only the amplifiers A11 and A21 but also an additional circuit, such as a digital control circuit for driving the amplifiers A11 and A21, to be integrated in the central portion C. Accordingly, since the amplifier A11 and the amplifier A22 are capable of being integrated, the number of the lines is decreased, compared with a case in which the amplifier A11 and the amplifier A21 are individually arranged. Consequently, since the space is not wasted and the use efficiency of the substrate area is improved, it is possible to realize the more compact radio-frequency module 10.

The amplifier A11 and the amplifier A21 may be composed of the single integrated device IC5 with, for example, an additional circuit, such as a digital control circuit. Since the use of the single integrated device IC5 further improves the use efficiency of the substrate area, it is possible to reduce the size of the radio-frequency module 10 more effectively. In addition, since the number of the components that are mounted is decreased, the mounting cost is reduced.

When the filters F11 and F21 correspond to a common frequency band in each of the module connected to the diversity antenna and the module connected to the MIMO antenna, the filter F11 and the filter F21 may be formed in an integrated component.

Since it is not necessary to provide a gap between the components in the above case, compared with a case in which the filter F11 and the filer F21 formed on separate components are used, it is possible to further reduce the size of the radio-frequency module 10. In addition, since the number of the components that are mounted is decreased, the mounting cost is reduced.

Three first mounted components including combinations of the filter F11 and the inductor L11, the filter F12 and the inductor L12, and the filter F13 and the inductor L13 may be provided for the respective corresponding frequency bands (not illustrated). Similarly, three second mounted components including combinations of the filter F21 and the inductor L21, the filter F22 and the inductor L22, and the filter F23 and the inductor L23 may be provided for the respective corresponding frequency bands (not illustrated). Here, the filters F11 to F13 are an example of multiple first filters and the inductors L11 to L13 are an example of multiple third matching elements. The filters F21 to F23 are an example of multiple second filters and the inductors L21 to L23 are an example of multiple fourth matching elements.

In such a configuration, the first mounted component and the second mounted component, which correspond to a common frequency band, may be arranged at positions that are practically axisymmetric to each other with respect to a symmetric axis, which is the boundary line D between the first portion A and the second portion B of the substrate 13.

Since this enables the wiring pattern to be designed using the symmetry of the arrangement of the components for the portions corresponding to the common frequency band of the first circuit 11 and the second circuit 12, for example, the wiring length of the first circuit 11 for the diversity is capable of being made equal to the wiring length of the second circuit 12 for the MIMO to facilitate unification of phase characteristics of the first circuit 11 and the second circuit 12. Accordingly, the phase design of the radio-frequency module 10 is rationalized.

In addition, the amplifier A11 and the amplifier A21 are arranged on the main surface 15 in the central portion C of the substrate 13 and the inductor L17 and the inductor L27 are arranged on the main surface 14 in the central portion C of the substrate 13. Here, the main surface 15 is an example of a first main surface and the main surface 14 is an example a second main surface. The inductor L17 is an example of a first inductor and the inductor L27 is an example of a second inductor.

As described above, the inductor L17 and the inductor L27 are used as the matching inductors for input into the amplifier A11 and the amplifier A21, respectively. In general, when the wiring length from the matching inductor to the amplifier is long, the matching may be shifted due to parasitic capacitance occurring in the wiring and, thus, various characteristics of the radio-frequency module, including the noise figures and the gains of the amplifiers, are likely to be degraded.

In this regard, in the radio-frequency module 10, the inductor L17 is connected to the input end of the amplifier A11 and the inductor L27 is connected to the input end of the amplifier A21 with short lines 16a passing through the substrate 13 in the central portion C of the substrate 13, as illustrated in FIG. 2B. Since the shift of the matching is suppressed owing to this configuration, it is possible to realize the compact radio-frequency module 10 having excellent characteristics.

The advantages of this will now be described in more detail based on comparison with a comparative example.

FIG. 3 is a side view schematically illustrating an example of the arrangement of components in a radio-frequency module 90 according to the comparative example. As illustrated in FIG. 3, in the radio-frequency module 90, the amplifiers A11 and A21 are arranged in peripheral portions of the substrate 13 so as to be apart from each other (in left and right portions in FIG. 3) and the inductors L17 and L27 are arranged in peripheral portions of the substrate 13 so as to be apart from each other (in left and right portions in FIG. 3).

In this case, the inductors L17 and L27 mounted on the main surface 14 are capable of being arranged along outermost portions of the substrate 13. In contrast, the amplifiers A11 and A21 mounted on the main surface 15 are not capable of being arranged along outermost portions of the substrate 13 because the presence of the input terminals P10 and P20. As a result, a line 16b between the inductor L17 and the amplifier A11 and the line 16b between the inductor L27 and the amplifier A21 are longer than the lines 16a to constitute a limiting factor of the characteristics of the radio-frequency module 90.

Setting back the inductors L17 and L27 toward the inside of the substrate 13 to positions overlapped with the amplifiers A11 and A21, respectively, in a plan view makes the lengths of the lines 16b equal to those of the lines 16a to remove the factor of limiting the characteristics of the radio-frequency module 90. However, since the portions corresponding to the input terminals P10 and P20 on the main surface 15 become dead spaces to limit the reduction in size of the radio-frequency module 90.

As described above, in the radio-frequency module 90 in which the amplifier A11 and the amplifier A21 are arranged not in the central portion C but in peripheral portions of the substrate 13, it is not possible to optimize tradeoff between the characteristics of the radio-frequency module 90 and the reduction in size thereof. Accordingly, arranging the amplifier A11 and the amplifier A21 in the central portion C is effective for realizing the compact radio-frequency module having excellent characteristics.

Second Embodiment

A radio-frequency module according to a second embodiment will now be described, giving as an example a module that processes reception signals through a diversity antenna and a MIMO antenna in a communication apparatus including a main antenna, the diversity antenna, and the MIMO antenna. The radio-frequency module exemplified here supports carrier aggregation communication in which communication is performed by concurrently using multiple frequency bands.

Figure 4:
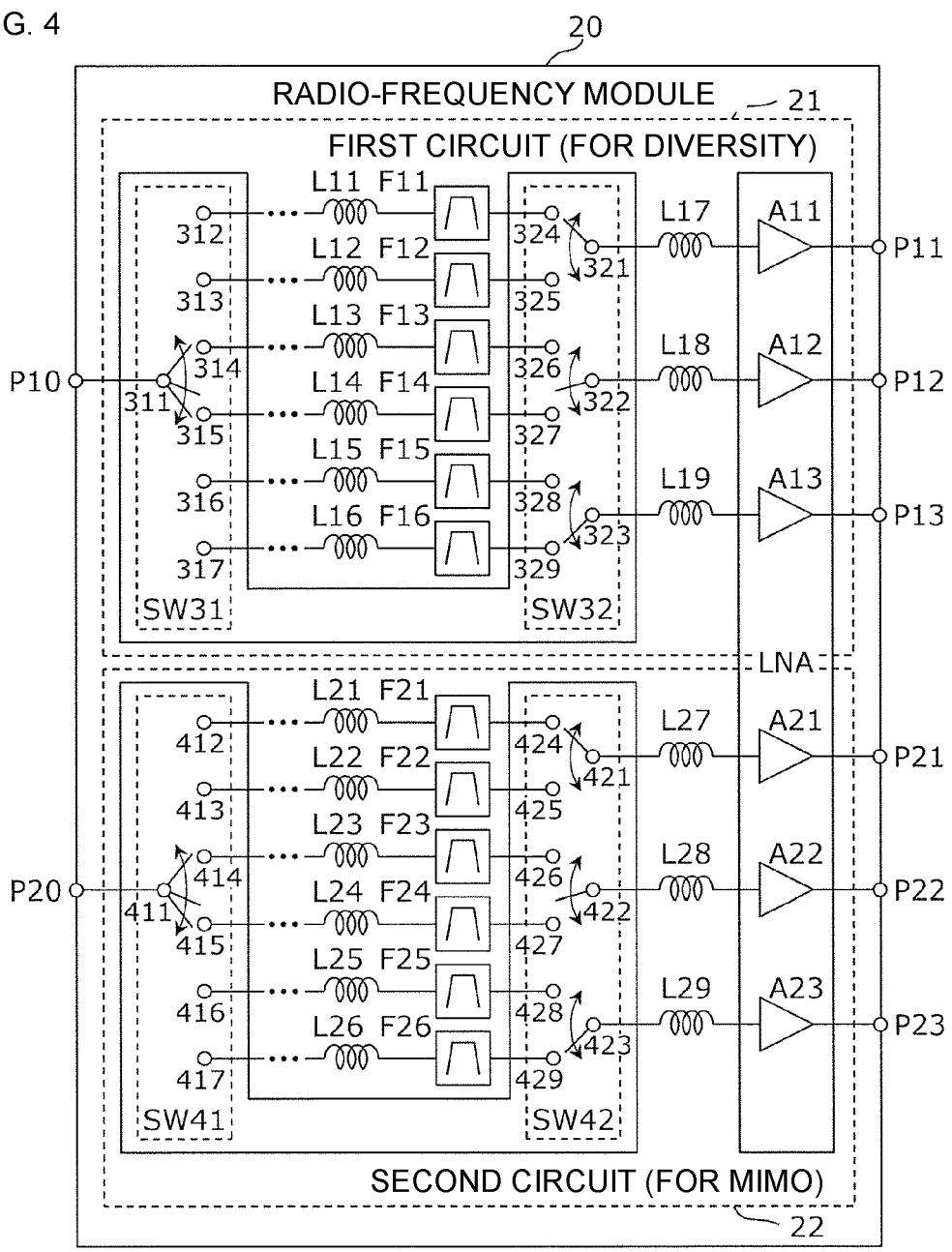
FIG. 4 is a circuit diagram illustrating an example of the functional circuit configuration of a radio-frequency module according to a second embodiment.

FIG. 4 is a circuit diagram illustrating an example of the functional circuit configuration of a radio-frequency module 20 according to the second embodiment. Referring to FIG. 4, the radio-frequency module 20 includes a first circuit 21 for the diversity and a second circuit 22 for the MIMO.

The first circuit 21 differs from the first circuit 11 in the radio-frequency module 10 illustrated in FIG. 1 in the following points. Specifically, inductors L14 to L16, L18, and L19, filters F14 to F16, amplifiers A12 and A13, and output terminals P12 and P13 are added and the switches SW11 and SW12 are replaced with switches SW31 and SW32, respectively. Here, the inductors L17, L18, and L19 are an example of multiple first inductors, the amplifiers A11, A12, and A13 are an example of multiple first amplifiers, and the filters F11 to F16 are an example of multiple first filters.

The second circuit 22 differs from the second circuit 12 in the radio-frequency module 10 illustrated in FIG. 1 in the following points. Specifically, inductors L24 to L26, L28, and L29, filters F24 to F26, amplifiers A22 and A23, and output terminals P22 and P23 are added and the switches SW21 and SW22 are replaced with switches SW41 and SW42, respectively. Here, the inductors L27, L28, and L29 are an example of multiple second inductors, the amplifiers A21, A22, and A23 are an example of multiple second amplifiers, and the filters F21 to F26 are an example of multiple second filters.

It is assumed for convenience of description that the first circuit 21 and the second circuit 22 have the same circuit configuration, and the circuit configuration of the first circuit 21 will be representatively described here.

The input terminal P10 acquires reception signals received with the diversity antenna. Signals of the multiple frequency bands used in the carrier aggregation communication are included in the reception signals.

The switch SW31 has a common terminal 311 and selection terminals 312 to 317. The switch SW31 connects the common terminal 311 to one or more selection terminals of the selection terminals 312 to 317 in accordance with a control signal (not illustrated). The common terminal 311 is connected to the input terminal P10.

The switch SW32 has common terminals 321, 322, and 323 and selection terminals 324 to 329. The switch SW32 selects one selection terminal, among the selection terminals 324 to 329, for each common terminal to the corresponding common terminal, among the common terminals 321, 322, and 323, in accordance with a control signal (not illustrated).

The inductors L11 to L16 and the filters F11 to F16 are provided for first to sixth frequency bands, respectively, used in the carrier aggregation communication.

The inductors L11 to L16 are matching elements for achieving impedance matching at input ends of the filters F11 to F16, respectively. The inductors L11 to L16 are connected on signal paths connecting the selection terminals 312 to 317 of the switch SW31 to the input ends of the filters F11 to F16, respectively.

The filters F11 to F16 are band pass filters that selectively transmit signals of the corresponding frequency bands. One ends of the filters F11 to F16 are connected to the selection terminals 312 to 317 of the switch SW31, respectively. The other ends of the filters F11 to F16 are connected to the selection terminals 324 to 329 of the switch SW32, respectively.

The inductors L17 to L19 are matching elements for achieving impedance matching at input ends of the amplifiers A11 to A13, respectively. The inductors L17 to L19 are connected on signal paths connecting the common terminals 321 to 323 of the switch SW32 to the input ends of the amplifiers A11 to A13, respectively.

The amplifiers A11 to A13 are low noise amplifiers. The input ends of the amplifiers A11 to A13 are connected to the common terminals 321 to 323 of the switch SW32, respectively, and the output ends of the amplifiers A11 to A13 are connected to the output terminals P11 to P13, respectively. Each of the amplifiers A11 to A13 may include an additional circuit, such as a digital control circuit, in addition to a main semiconductor element that amplifies a signal.

With the above configuration, the first circuit 21 concurrently amplifies the signals of the multiple frequency bands, which are included in the reception signals through the diversity antenna.

The second circuit 22 has the same circuit configuration as that of the first circuit 21 and concurrently amplifies the signals of the multiple frequency bands, which are included in the reception signals through the MIMO antenna. Reference letters and numerals resulting from replacement of the first figures of the reference letters and numerals of the corresponding circuit elements in the first circuit 21 with two or four are add to the respective circuit elements in the second circuit 22 and a description of the circuit elements in the second circuit 22 is omitted herein.

The circuit configuration of the radio-frequency module 20 in FIG. 4 is only an example for description and is not intended to limit the circuit configuration of the radio-frequency module. For example, although the inductors L11 to L19 and L21 to L29 are indicated as series Ls inserted into the signal paths in FIG. 4, the inductors L11 to L19 and L21 to L29 may be parallel Ls the one ends of which are connected to the signal paths and the other ends of which are grounded. In addition, matching inductors, which are not illustrated in FIG. 4, may be additionally provided.

The radio-frequency module 20 is practically configured by arranging the specific components functioning as the circuit elements described with reference to FIG. 4 on a substrate. How the components in the radio-frequency module 20 are arranged will now be described.

Figure 5A:
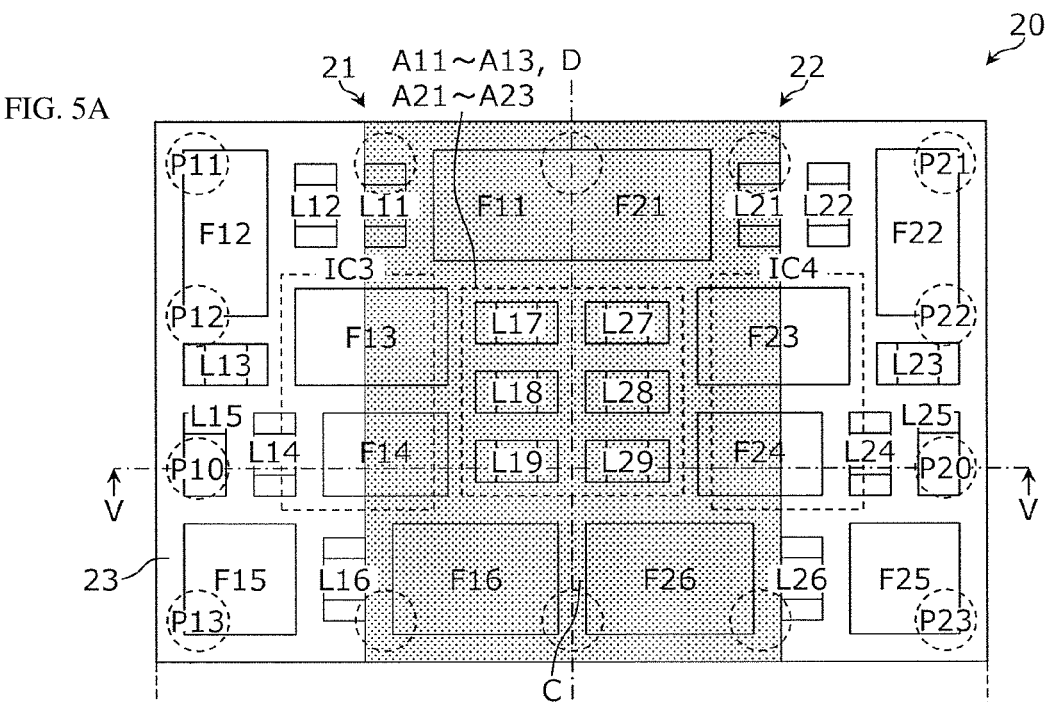
FIG. 5A and FIG. 5B are a plan view and a side view schematically illustrating an example of the arrangement of components in the radio-frequency module according to the second embodiment.
Figure 5B:
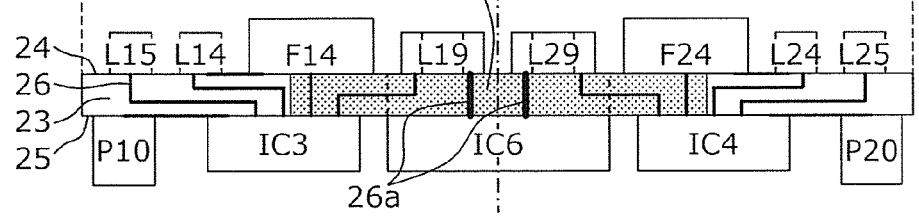

FIG. 5A and FIG. 5B are a plan view and a side view schematically illustrating an example of the arrangement of the components in the radio-frequency module 20. FIG. 5A is a plan view when a substrate 23 is viewed from a main surface 24 side. The components arranged on the main surface 24 are indicated with solid lines and the components arranged on a main surface 25 are indicated with broken lines. FIG. 5B is a side view when the circuit components appearing on the cross-section taken along the V-V line in FIG. 5A are viewed from the direction of arrows.

As illustrated in FIG. 5A and FIG. 5B, the radio-frequency module 20 is configured by arranging the multiple components on the main surfaces 24 and 25 of the substrate 23 and connecting the components with lines 26.

Chip inductors L11 to L29 and filter components F11 to F16 and F21 to F26 are mounted on the main surface 24 of the substrate 23.

The chip inductors L11 to L19 and L21 to L29 function as the inductors L11 to L19 and L21 to L29 to which the same reference letters and numerals are added in FIG. 4. The chip inductors L11 to L19 and L21 to L29 may be of a winding type composed of a conducting line that is wound around a core or may be of a laminated type composed of a conductor pattern that is formed around a laminated substrate in a substantially coiled shape, as a non-limited example.

The filter components F11 to F16 and F21 to F26 function as the filters F11 to F16 and F21 to F26 to which the same reference letters and numerals are added in FIG. 4. Each of the filter components F11 to F16 and F21 to F26 may be an LC filter composed of an inductor and a capacitor or may be an acoustic wave filter using an acoustic wave device, as a non-limited example.

Integrated devices IC3, IC4, and IC6 are mounted on the main surface 25 of the substrate 23, and the input terminals P10 and P20 and the output terminals P11 to P13 and P21 to P23 are provided on the main surface 25 of the substrate 23. Broken-line circles with no reference letter and numeral illustrated in FIG. 5A may be a power supply, ground, and various control-signal terminals.

The integrated device IC3 is an IC in which the switches SW31 and SW32 illustrated in FIG. 4 are integrated in a single package. The integrated device IC4 is an IC in which the switches SW41 and SW42 illustrated in FIG. 4 are integrated in a single package.

The integrated device IC6 is an IC in which the amplifiers A11 to A13 and A21 to A23 illustrated in FIG. 4 are integrated in a single package with an additional circuit, such as a digital control circuit.

Each of the terminals including the input terminals P10 and P20 and the output terminals P11 to P13 and P21 to P23 is an electrode pin having a profile higher than those of the integrated devices IC3, IC4, and IC6 and functions as a connection terminal in mounting of the radio-frequency module 20 on a mother board.

The components arranged on the main surface 24 are connected to the components arranged on the main surface 25 with the lines 26 provided in the thickness direction and the in-plane direction of the substrate 23 to from the first circuit 21 and the second circuit 22.

As illustrated in FIG. 5A and FIG. 5B, the first circuit 21 is formed in a first portion A (the left half in the example in FIG. 5A and FIG. 5B) in a plan view of the substrate 23 and the second circuit 22 is formed in a second portion B (the right half in the example in FIG. 5A and FIG. 5B) being in contact with the first portion A in a plan view of the substrate 23.

The amplifiers A11 to A13 and A21 to A23 are arranged in a central portion C (a shaded area in the example in FIG. 5A and FIG. 5B) of the substrate 23 as the integrated device IC6, which is a single component. Here, the central portion C may mean an area that includes a boundary line D between the first portion A and the second portion B and that does not include the circuit components other than the amplifiers A11 to A13 and A21 to A23 and the inductors L17 to L19 and L27 to L29. In other words, when the circuit components other than the amplifiers A11 to A13 and A21 to A23 and the inductors L17 to L19 and L27 to L29 are arranged in peripheral portions of the substrate 23, the central portion C is a portion excluding the peripheral portions of the substrate 23.

The inductors L17, L18, and L19 are arranged in line along the boundary line D at the first portion A side of the central portion C, and the inductors L27, L28, and L29 are arranged in line along the boundary line D at the second portion B side of the central portion C.

In such arrangement, since the adjacent inductors (the inductors L17 and L18, the inductors L18 and L19, the inductors L27 and L28, and the inductors L28 and L29), among the inductors L17 to L19 and L27 to L29, are close to each other, coupling is likely to occur. Leakage of signals, which is caused by the coupling between the inductors, may cause degradation of various characteristics, such as the noise figure, of the radio-frequency module 20.

In order to resolve the above problem, the radio-frequency module 20 is configured so that the adjacent inductors process signals of different frequency bands (that is, frequency bands the frequency ranges of which are not overlapped with each other).

Bands B30 and B40 and Bands B7 and B41, which are defined in Long Term Evolution (LTE) communication standard, are exemplified as combinations of the frequency bands the frequency ranges of which are overlapped with each other. The radio-frequency module 20 may be configured so that the signals of the frequency bands of such combinations are processed by the amplifiers A11 and A13 or the amplifiers A21 and A23, which are connected to two inductors that are not adjacent to each other.

In addition, for example, the radio-frequency module 20 may be configured so that the signals of the frequency bands belonging to a high band group, a middle band group, and a low band group the frequency ranges of which are different from each other, are amplified by the amplifiers A11, A12, and A13, respectively. Similarly, the radio-frequency module 20 may be configured so that the signals of the frequency bands belonging to the middle band group, the low band group, and the high band group are amplified by the amplifier A21, A22, and A23, respectively.

With the above configurations, since the adjacent inductors process the signals of the frequency bands that are different from each other, it is possible to further suppress the degradation of the characteristics of the radio-frequency module 20 even if the leakage of signals is caused by the coupling between the adjacent inductors, compared with a case in which signals of the same frequency band leak.

Furthermore, the radio-frequency module 20 may be configured so that the center axes of the inductors L17 to L19 and L27 to L29, that is, the central axes of windings or substantially coiled conductors composing the inductors are not parallel between the adjacent inductors in mounting. Here, the non-parallel includes intersection and twist. For example, the chip inductors of a kind in which the center axis in mounting is vertical to the mounting face and the chip inductors of a kind in which the center axis in mounting is parallel to the mounting face may be alternately used as the inductors L17 to L19 and L27 to L29 arranged in the direction of the boundary line D.

As described above, since arranging the center axes of the adjacent inductors, among the inductors L17 to L29, so as not to be parallel to each other reduces magnetic flux interlinked between the inductors, the leakage of signals, which is caused by the coupling between the adjacent inductors, is reduced. Accordingly, it is possible to further suppress the degradation of the characteristics of the radio-frequency module 20, compared with a case in which the center axes of the adjacent inductors are parallel to each other.

Third Embodiment

In a third embodiment, a communication apparatus including either of the radio-frequency modules described in the first and second embodiments will be described.

Figure 6:
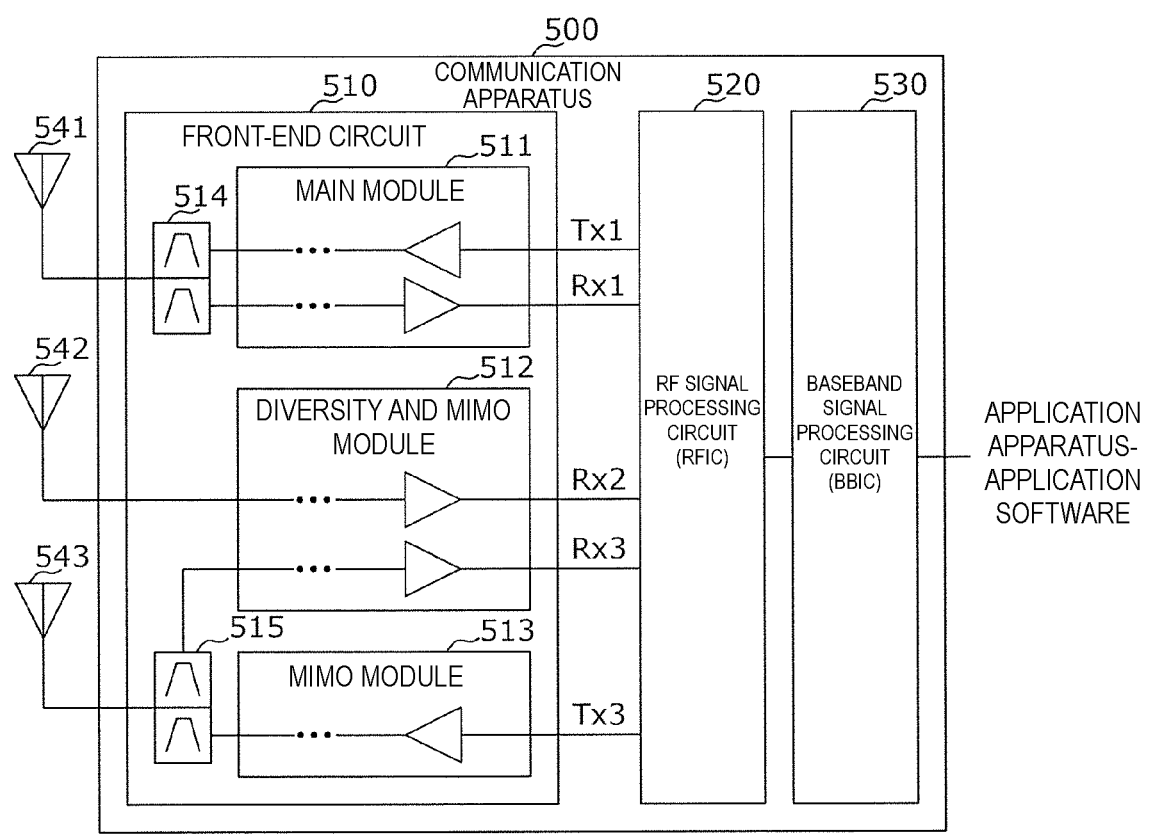
FIG. 6 is a block diagram illustrating an example of the functional configuration of a communication apparatus according to a third embodiment.

FIG. 6 is a block diagram illustrating an example of the functional configuration of a communication apparatus 500 according to the third embodiment. Referring to FIG. 6, the communication apparatus 500 includes a front-end circuit 510, an RF signal processing circuit 520, and a baseband signal processing circuit 530. A diversity antenna 542, a MIMO antenna 543, and a main antenna 541 are illustrated in FIG. 6, in addition to the communication apparatus 500. The diversity antenna 542, the MIMO antenna 543, and the main antenna 541 are examples of a first antenna, a second antenna, and a third antenna, respectively. The main antenna 541, the diversity antenna 542, and the MIMO antenna 543 may be included in the communication apparatus 500.

The front-end circuit 510 includes a main module 511, a diversity and MIMO module 512, a MIMO module 513, and duplexers 514 and 515.

The main module 511 amplifies a transmission RF signal Tx1 for the main antenna, received from the RF signal processing circuit 520, with a power amplifier and supplies the amplified transmission RF signal Tx1 to the duplexer 514.

The duplexer 514 supplies the transmission RF signal Tx1 amplified by the main module 511 to the main antenna 541 and supplies a reception RF signal Rx1 received with the main antenna 541 to the main module 511.

The main module 511 amplifies the reception RF signal Rx1 for the main antenna, received from the duplexer 514, with a low noise amplifier and supplies the amplified reception RF signal Rx1 to the RF signal processing circuit 520.

The diversity and MIMO module 512 amplifies a reception RF signal Rx2 received with the diversity antenna 542 with a low noise amplifier and supplies the amplified reception RF signal Rx2 to the RF signal processing circuit 520. In addition, the diversity and MIMO module 512 amplifies a reception RF signal Rx3 for the MIMO antenna, received from the duplexer 515, with the low noise amplifier and supplies the amplified reception RF signal Rx3 to the RF signal processing circuit 520.

Either of the radio-frequency modules 10 and 20 described in the first and second embodiments, respectively, is used as the diversity and MIMO module 512.

The MIMO module 513 amplifies a transmission RF signal Tx3 for the MIMO antenna, received from the RF signal processing circuit 520, with a power amplifier and supplies the amplified transmission RF signal Tx3 to the duplexer 515.

The duplexer 515 supplies the transmission RF signal Tx3 amplified by the MIMO module 513 to the MIMO antenna 543 and supplies the reception RF signal Rx3 received with the MIMO antenna 543 to the diversity and MIMO module 512.

The RF signal processing circuit 520 converts a transmission signal received from the baseband signal processing circuit 530 into the transmission RF signals Tx1 and Tx3 for the respective antennas and supplies the transmission RF signals Tx1 and Tx3 to the front-end circuit 510. The conversion may include modulation of the signal, up-conversion, and signal processing for the MIMO transmission.

In addition, the RF signal processing circuit 520 converts the reception RF signals Rx1, Rx2, and Rx3 for the respective antennas, received from the front-end circuit 510, into a reception signal and supplies the reception signal to the baseband signal processing circuit 530. The conversion may include demodulation of the signals, down-conversion, and signal processing for the diversity and MIMO reception.

The RF signal processing circuit 520 may be composed of a radio-frequency integrated circuit (RFIC) chip.

The baseband signal processing circuit 530 converts transmission data generated by an application apparatus-application software that performs audio call, image display, or the like into a transmission signal and supplies the transmission signal to the RF signal processing circuit 520. The conversion may include compression of the data, multiplexing, and addition of an error correction code. In addition, the baseband signal processing circuit 530 converts a reception signal received from the RF signal processing circuit 520 into reception data and supplies the reception data to the application apparatus-application software. The conversion may include decompression of the data, demultiplexing, error correction. The baseband signal processing circuit 530 may be composed of a baseband integrated circuit (BBIC) chip.

With the communication apparatus configured in the above manner, it is possible to appropriately select the basic communication using only the main antenna 541, the diversity communication using the main antenna 541 and the diversity antenna 542, and the MIMO communication using the main antenna 541 and the MIMO antenna 543 to perform the selected communication.

With the communication apparatus 500, since the compact radio-frequency module 10 or 20 is used for the diversity and MIMO module 512, it is possible to achieve the reduction in size of the communication apparatus.

(Outline)

As described above, a radio-frequency module according to one aspect of the present disclosure includes a substrate, a first circuit that is arranged on the substrate and that includes a first amplifier for amplifying a diversity signal, and a second circuit that is arranged on the substrate and that includes a second amplifier for amplifying a MIMO signal. The first amplifier and the second amplifier are formed on a single component and are arranged in a central portion in a plan view of the substrate.

With the above configuration, arranging the first amplifier for the diversity and the second amplifier for the MIMO in the central portion of the substrate enables an additional circuit, such as a digital control circuit for driving the first amplifier and the second amplifier, to be integrated in the central portion of the substrate. Since this enables the first amplifier and the second amplifier to be integrated, the number of the lines is decreased, compared with a case in which the first amplifier and the second amplifier are individually arranged. Accordingly, since the space is not wasted and the use efficiency of the substrate area is improved, it is possible to realize the more compact radio-frequency module. The first amplifier and the second amplifier may be composed of a signal integrated device with an additional circuit, such as a digital control circuit. Since the use of a signal integrated device further improves the use efficiency of the substrate area, it is possible to reduce the size of the radio-frequency module more effectively. In addition, since the number of the components that are mounted is decreased, the mounting cost is reduced.

In the radio-frequency module, the first circuit may include a first matching element connected to the first amplifier, the second circuit may include a second matching element connected to the second amplifier, the first amplifier and the second amplifier may be arranged in the central portion on a first main surface of the substrate, and the first matching element and the second matching element may be arranged in the central portion on a second main surface of the substrate.

In general, when the wiring length between the matching inductor and the amplifier is long, the matching may be shifted due to parasitic capacitance occurring in the wiring and, thus, various characteristics of the radio-frequency module, including the noise figures and the gains of the amplifiers, are likely to be degraded. In this regard, with the above configuration, the first matching element is capable of being connected to the first amplifier and the second matching element is capable of being connected to the second amplifier with short lines passing through the substrate in the central portion of the substrate. Accordingly, since the matching elements are capable of being connected to the amplifiers with shorter lines, compared with a case in which the lines are routed in the in-plane of the substrate, the shift of the matching is suppressed and, thus, the compact radio-frequency module having excellent characteristics is realized.

In the radio-frequency module, the first amplifier may include multiple first amplifiers, the second amplifier may include multiple second amplifiers, the first matching element may include multiple first inductors connected to the different first amplifiers and the multiple first inductors may be arranged in line in the central portion of the substrate, the second matching element may include multiple second inductors connected to the different second amplifiers and the multiple second inductors may be arranged in line in the central portion of the substrate, and the adjacent first inductors, among the multiple first inductors, may process signals of different frequency bands and the adjacent second inductors, among the multiple second inductors, may process signals of different frequency bands.

In the above configuration, since the adjacent first inductors and the adjacent second inductors are close to each other, the coupling is likely to occur. Leakage of signals, which is caused by the coupling between the inductors, may cause degradation of various characteristics, typified by the noise figure, of the radio-frequency module. In this regard, with the above configuration, the first inductor and the second inductor, which are adjacent to each other, process the signals of the frequency bands that are different from each other. Accordingly, it is possible to further suppress the degradation of the characteristics of the radio-frequency module even if the leakage of signals is caused by the coupling between the first inductor and the second inductor, compared with a case in which signals of the same frequency band leak.

In the radio-frequency module, the first amplifier may include multiple first amplifiers, the second amplifier may include multiple second amplifiers, the first matching element may include multiple first inductors connected to the different first amplifiers and the multiple first inductors may be arranged in line in the central portion of the substrate, the second matching element may include multiple second inductors connected to the different second amplifiers and the multiple second inductors may be arranged in line in the central portion of the substrate, each of the multiple first inductors and the multiple second inductors may be composed of a substantially coiled conductor provided around a center axis, and the center axes in mounting of the adjacent first inductors, among the multiple first inductors, may not be parallel to each other and the center axes in mounting of the adjacent second inductors, among the multiple second inductors, may not be parallel to each other.

In the above configuration, since the adjacent first inductors and the adjacent second inductors are close to each other, the coupling is likely to occur. Leakage of signals, which is caused by the coupling between the inductors, may cause degradation of various characteristics, typified by the noise figure, of the radio-frequency module. In this regard, with the above configuration, since the center axes of the substantially coiled conductors composing the adjacent first inductors and the adjacent second inductors are not parallel to each other, magnetic flux interlinked between the inductors is reduced to reduce the leakage of signals, which is caused by the coupling. Accordingly, it is possible to further suppress the degradation of the characteristics of the radio-frequency module, compared with a case in which the center axes of the adjacent inductors are parallel to each other.

In the radio-frequency module, the first circuit may include multiple first filters corresponding to different frequency bands, the second circuit may include multiple second filters corresponding to different frequency bands, and the first filter and the second filter corresponding to a common frequency band, among the multiple first filters and the multiple second filters, may be formed in an integrated component.

With the above configuration, since it is not necessary to provide a gap between the components, compared with a case in which the first filter and the second filter formed on separate components are used, it is possible to further reduce the size of the radio-frequency module. In addition, since the number of the components that are mounted is decreased, the mounting cost is reduced.

In the radio-frequency module, the first circuit may include multiple first mounted components including multiple first filters and multiple third matching elements, which correspond to different frequency bands, the second circuit may include multiple second mounted components including multiple second filters and multiple fourth matching elements, which correspond to different frequency bands, and the first mounted component and the second mounted component corresponding to a common frequency band, among the multiple first mounted components and the multiple second mounted components, may be arranged at positions that are practically axisymmetric to each other with respect to a symmetric axis, which is a boundary between a first portion having the first circuit formed therein and a second portion having the second circuit formed therein on the substrate.

With the above configuration, since the wiring pattern is capable of being designed using the symmetry of the arrangement of the components for the portions corresponding to the common frequency band of the first circuit and the second circuit, for example, the wiring length of the first circuit functioning as the diversity module is capable of being made equal to the wiring length of the second circuit functioning as the MIMO module to facilitate unification of phase characteristics of the first circuit and the second circuit. Accordingly, the phase design of the radio-frequency module is rationalized.

A communication apparatus according to one aspect of the present disclosure includes the radio-frequency module and a radio-frequency signal processing circuit connected to the radio-frequency module.

With the above configuration, the use of the compact radio-frequency module achieves the reduction in size of the communication apparatus.

Although the radio-frequency module and the communication apparatus according to the embodiments of the present disclosure are described above, the present disclosure is not limited to the individual embodiments. Modifications resulting from making various changes supposed by the persons skilled in the art to the above embodiments and modes built by combining components in different embodiments may also be included in the range of one or multiple aspects of the present disclosure without necessarily departing from the scope and sprit of the present disclosure.

The present disclosure is widely usable for a communication apparatus, such as a mobile phone or a mobile information terminal, as the radio-frequency module and the communication apparatus including the radio-frequency module.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio-frequency module comprising:
   a substrate;
   a first circuit that is arranged on the substrate and that comprises a first amplifier configured to amplify a diversity signal; and
   a second circuit that is arranged on the substrate and that comprises a second amplifier configured to amplify a multiple input multiple output (MIMO) signal,
   wherein the first amplifier and the second amplifier are embodied as a single component and are arranged in a central portion of the substrate as seen in a plan view of the substrate, the central portion being a middle 50% of the substrate,
   wherein the first circuit comprises a first impedance matching circuit element connected to the first amplifier,
   wherein the second circuit comprises a second impedance matching circuit element connected to the second amplifier,
   wherein the first amplifier and the second amplifier are arranged in the central portion on a first main surface of the substrate, and
   wherein the first impedance matching circuit element and the second impedance matching circuit element are arranged in the central portion on a second main surface of the substrate.

2. The radio-frequency module according to claim 1,
   wherein the first circuit comprises a plurality of first mounted components, the plurality of first mounted components comprising a plurality of first filters and a plurality of third impedance matching circuit elements, each of the first filters corresponding to different frequency bands and each of the third impedance matching circuit elements corresponding to different frequency bands,
   wherein the second circuit comprises a plurality of second mounted components, the plurality of second mounted components comprising a plurality of second filters and a plurality of fourth impedance matching circuit elements, each of the second filters corresponding to different frequency bands and each of the fourth impedance matching circuit elements corresponding to different frequency bands, and
   wherein one of the first mounted components and one of the second mounted components are arranged on the substrate symmetrically about an axis between the first circuit and the second circuit, the one of the first mounted components and the one of the second mounted components corresponding to a common frequency band.

3. The radio-frequency module according to claim 1,
   wherein the first amplifier comprises a plurality of first unit amplifiers,
   wherein the second amplifier comprises a plurality of second unit amplifiers,
   wherein the first impedance matching circuit element comprises a plurality of first inductors each connected to a different one of the first unit amplifiers,
   wherein the plurality of first inductors are arranged linearly in the central portion of the substrate,
   wherein the second impedance matching circuit element comprise a plurality of second inductors each connected to a different one of the second unit amplifiers, wherein the plurality of second inductors are arranged linearly in the central portion of the substrate, and wherein adjacently arranged first inductors are configured to process signals of different frequency bands, and adjacently arranged second inductors are configured to process signals of different frequency bands.

4. The radio-frequency module according to claim 1, wherein the first amplifier comprises a plurality of first unit amplifiers, wherein the second amplifier comprises a plurality of second unit amplifiers, wherein the first impedance matching circuit element comprises a plurality of first inductors each connected to a different one of the first unit amplifiers, wherein the plurality of first inductors are arranged linearly in the central portion of the substrate, wherein the second impedance matching circuit element comprises a plurality of second inductors each connected to a different one of the second unit amplifiers, wherein the plurality of second inductors are arranged linearly in the central portion of the substrate, wherein each of the plurality of first inductors and the plurality of second inductors comprises a substantially coiled conductor around a center axis, and wherein the center axes of adjacently arranged first inductors are not parallel to each other, and the center axes of adjacently arranged second inductors are not parallel to each other.

5. The radio-frequency module according to claim 1, wherein the first circuit comprises a plurality of first filters, each of the first filters corresponding to different frequency bands, wherein the second circuit comprises a plurality of second filters, each of the second filters corresponding to different frequency bands, and wherein one of the first filters and one of the second filters are embodied as an integrated circuit component, the one of the first filters and the one of the second filters corresponding to a common frequency band.

6. A communication apparatus comprising:

the frequency module according to claim 1; and a radio-frequency signal processing circuit connected to the radio-frequency module.

7. The radio-frequency module according to claim 3, wherein the first circuit comprises a plurality of first filters, each of the first filters corresponding to different frequency bands, wherein the second circuit comprises a plurality of second filters, each of the second filters corresponding to different frequency bands, and wherein one of the first filters and one of the second filters are embodied as an integrated circuit component, the one of the first filters and the one of the second filters corresponding to a common frequency band.

8. The radio-frequency module according to claim 4, wherein the first circuit comprises a plurality of first filters, each of the first filters corresponding to different frequency bands, wherein the second circuit comprises a plurality of second filters, each of the second filters corresponding to different frequency bands, and wherein one of the first filters and one of the second filters are embodied as an integrated circuit component, the one of the first filters and the one of the second filters corresponding to a common frequency band.

9. The radio-frequency module according to claim 5, wherein the one of the first filters and the one of the second filters are arranged in the central portion of the substrate.

* * * * *

UNITED STATES PATENT AND TRADEMARK OFFICE
CERTIFICATE OF CORRECTION

| | |
|---|---|
| PATENT NO. | : 11,296,660 B2 |
| APPLICATION NO. | : 16/829477 |
| DATED | : April 5, 2022 |
| INVENTOR(S) | : Yusuke Naniwa |

It is certified that error appears in the above-identified patent and that said Letters Patent is hereby corrected as shown below:

In the Claims

Claim 6, Column 18, Line 6, "the frequency module" should be -- the radio-frequency module --.

Signed and Sealed this
Thirty-first Day of January, 2023

Katherine Kelly Vidal
*Director of the United States Patent and Trademark Office*